United States Patent
Wu et al.

(10) Patent No.: US 9,617,636 B2
(45) Date of Patent: Apr. 11, 2017

(54) SYSTEM AND METHOD FOR CONTROLLING WAFER AND THIN FILM SURFACE TEMPERATURE

(71) Applicant: HERMES-EPITEK CORPORATION, Taipei (TW)

(72) Inventors: Chung-Yuan Wu, Hsinchu (TW); Bu-Chin Chung, Hsinchu (TW)

(73) Assignee: HERMES-EPITEK CORPORATION, Taipei (TW)

(*) Notice: Subject to any disclaimer, the term of this patent is extended or adjusted under 35 U.S.C. 154(b) by 0 days.

(21) Appl. No.: 14/840,736

(22) Filed: Aug. 31, 2015

(65) Prior Publication Data

US 2016/0148803 A1 May 26, 2016

(30) Foreign Application Priority Data

Nov. 21, 2014 (TW) .............................. 103140562 A (51) Int. Cl.
| | |
|---|---|
| *H01L 21/02* | (2006.01) |
| *C23C 16/458* | (2006.01) |
| *C23C 16/46* | (2006.01) |
| *H01L 21/67* | (2006.01) |
| *H01L 21/687* | (2006.01) |

(52) U.S. Cl.
CPC .......... *C23C 16/4584* (2013.01); *C23C 16/46* (2013.01); *H01L 21/67248* (2013.01); *H01L 21/68764* (2013.01); *H01L 21/68771* (2013.01)

(58) Field of Classification Search
CPC ................................................ C23C 16/45508
See application file for complete search history.

(56) References Cited

U.S. PATENT DOCUMENTS

| | | | | |
|---|---|---|---|---|
| 2010/0183045 A1* | 7/2010 | Nakahara | ................ | C23C 14/08 374/130 |
| 2012/0060752 A1* | 3/2012 | Kiyotoshi | ......... | H01L 21/67109 118/52 |
| 2013/0343426 A1 | 12/2013 | Gurary et al. | | |
| 2015/0060013 A1* | 3/2015 | Buchberger, Jr. | . | H01J 37/32724 165/64 |
| 2015/0096496 A1* | 4/2015 | Suda | ................ | C23C 16/45508 118/730 |

FOREIGN PATENT DOCUMENTS

| | | |
|---|---|---|
| JP | 2003282461 A | 10/2003 |
| JP | 2006093315 A | 4/2006 |
| JP | 2010059497 A | 3/2010 |
| JP | 2010100914 A | 5/2010 |

* cited by examiner

*Primary Examiner* — Fernando L Toledo
*Assistant Examiner* — Valerie N Newton
(74) *Attorney, Agent, or Firm* — Huffman Law Group, PC (57) ABSTRACT

A vapor deposition system and its wafer and thin-film temperature control method are disclosed. A susceptor carries a plurality of wafer holders with each bearing a wafer. The susceptor makes revolution around a center axle and each wafer holder rotates around its own axis. A carrier gas approaches a first surface of the wafer and is heated to form a thin film to be deposited on the first surface. An isothermal plate is placed at a second surface of the wafer and the second surface is opposite to the first surface. One or more remote temperature-measuring elements measure a temperature of a rear surface of the isothermal plate and the rear surface is opposite to the wafer, and a wafer-side temperature is calculated by the measured rear surface temperature of the isothermal plate.

13 Claims, 6 Drawing Sheets

SYSTEM AND METHOD FOR CONTROLLING WAFER AND THIN FILM SURFACE TEMPERATURE

CROSS-REFERENCE TO RELATED APPLICATIONS

The entire contents of Taiwan Patent Application No. 103140562, filed on Nov. 21, 2014, from which this application claims priority, are incorporated herein by reference.

BACKGROUND OF THE INVENTION

1. Field of the Invention

The present invention relates to deposition system and method for controlling surface temperature of wafer and thin-film grown on the wafer.

2. Description of Related Art

Metal-Organic Chemical Vapor Deposition (MOCVD) is a process to deposit semiconductor thin-film on a surface. A carrier gas carries reactant gases and/or precursor gases into a chamber with a wafer. A susceptor under the wafer heats the wafer with a particular manner, so that the reactant gases or precursor gases approaching the wafer are heated to an elevated temperature. The elevated temperature will initiate one or several chemical reactions of the reactant gases or precursor gases, which are turned into solid products and then deposited on the surface of the wafer.

The temperature control for the wafer is an important factor during the MOCVD process. U.S. Patent Application US2013/0343426 discloses a temperature control method and system for growing GaN based materials. It employs a non-contact pyrometer 70 sensitive to radiation in a first wavelength band and a second wavelength band, so as to respectively measure the temperature of the susceptor and the surface temperature of the wafer. In addition, a wafer temperature measurement device 80, for example, a short wavelength pyrometer or an absorption shift based device, sensitive to radiation in a particular wavelength band, is used to measure the thin-film temperature during the MOCVD process. The inventor of the present invention considers that the conventional method has a problem which needs to be solved. Particles may be deposited on the surface of the wafer during the depositing process, and they will weaken the light signal of the temperature measurement device. Therefore, the measured temperature of an object, e.g., a surface of wafer, may be less than the real temperature of the object. If the inaccurately measured temperature is used to a feedback control of the temperature of the object, a target temperature of the object will be set too high. As a result, the high temperature will decrease the yield and may damage the components within the reactor chamber.

SUMMARY OF THE INVENTION

In one general aspect, the present invention relates to deposition system and method for controlling surface temperature of wafer and thin-film grown on the wafer.

According to an embodiment of this invention, a chemical vapor deposition system for controlling a surface temperature of the wafer or thin-film grown on the wafer is provided with a susceptor, a plurality of wafer holders, a processing gas, an isothermal plate, and one or more temperature-measuring elements. The susceptor rotates about an axis. The wafer holders are carried by the susceptor, and each wafer holder carries a wafer and rotates about its own axis. The processing gas approaches a first surface of the wafer and is heated to form a thin-film on the first surface. The isothermal plate is arranged at a second surface of the wafer for heating the wafer, and the second surface is opposite to the first surface. The one or more temperature-measuring elements are arranged at a side of the wafer and arranged near to the second surface to measure a rear surface temperature of the isothermal plate, wherein the rear surface temperature is used to obtain a wafer-side temperature of the wafer.

In an embodiment, the deposition system further comprises one or more wafer side temperature-measuring elements arranged at a side of the wafer and arranged near to the first surface to measure the wafer-side temperature of the wafer.

In an embodiment, the wafer-side temperature is the temperature of the first surface of the wafer.

In an embodiment, the wafer-side temperature is a temperature of a front surface of the isothermal plate, and the front surface of the isothermal plate faces the wafer.

In an embodiment, the wafer-side temperature is a surface temperature of a thin-film grown on the wafer.

In an embodiment, the deposition system is a wafer Face Up Metal-Organic Chemical Vapor Deposition system.

In an embodiment, the deposition system is a wafer Face Down Metal-Organic Chemical Vapor Deposition system.

In an embodiment, the one or more temperature-measuring elements comprises three infrared thermometers for measuring an inner zone rear surface temperature, a middle zone rear surface temperature, and an outer zone rear surface temperature of the isothermal plate.

According to another embodiment of this invention, a method for controlling a surface temperature of the wafer or thin-film grown on the wafer in a chemical deposition is provide with: providing a susceptor to rotate about an axis, the susceptor carrying a plurality of wafer holders with each wafer holder carrying a wafer and rotating about its own axis; providing a processing gas approaching a first surface of the wafer, the processing gas being heated to form a thin-film on the first surface; providing an isothermal plate arranged at a second surface of the wafer for heating the wafer, the second surface being opposite to the first surface; providing one or more temperature-measuring elements arranged at a side of the wafer and arranged near to the second surface to measure a rear surface temperature of the isothermal plate; and obtaining a wafer-side temperature of the wafer by the rear surface temperature of the isothermal plate.

DETAILED DESCRIPTION OF THE PREFERRED EMBODIMENT

Reference will now be made in detail to those specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not described in detail in order not to unnecessarily obscure the present invention. While drawings are illustrated in detail, it is appreciated that the quantity of the disclosed components may be greater or less than that disclosed, except where expressly restricting the amount of the components. Wherever possible, the same or similar reference numbers are used in drawings and the description to refer to the same or like parts.

Figure 1:
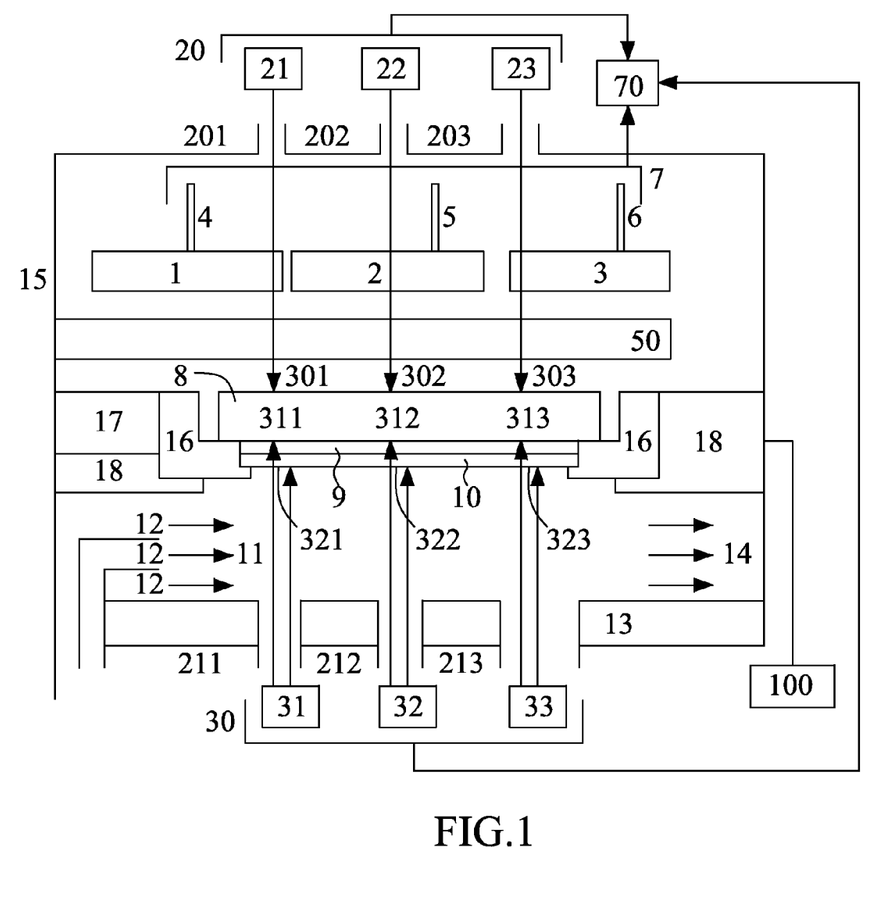
FIG. 1 is a simplified block diagram showing a (wafer Face-Down) chemical vapor deposition system and method according to a preferred embodiment of the present invention.

FIG. 1 is a simplified block diagram illustrating a chemical deposition system and method in accordance with a preferred embodiment of the present invention. In this preferred embodiment, the system and method are based on a (Wafer) Face Down configuration. The same theory and concept of which, however, can also be based on a Face Up configuration according to another embodiment of the present invention.

As shown in FIG. 1, the deposition system, such as Metal-Organic Chemical Vapor Deposition (MOCVD), comprises a susceptor 18 and a plurality of wafer holders 16. The susceptor 18 rotates around an axis 15 and each wafer holder 16 revolves around its own axis (not shown). FIG. 1 merely shows half of the deposition system, and the other half is symmetrically arranged at the other side of the axis 15. A susceptor driving system 100 is used to drive the susceptor 18 to rotate around the axis 15. Each wafer holder 16 carries a wafer 10 with a surface facing downward. A support plate 13 is arranged at a front of the wafer holder 16 and at a distance from the wafer 10, and a processing zone 11 is between the support plate 13 and the wafer holder 16. A processing gas 12 (e.g., carrier gas with reactant gases and/or precursor gases) pass through the processing zone 11, and some of which is heated to turn into solid products to be deposited on the surface of the wafer 10 and thus to form a thin-film on the surface of the wafer 10. The unreacted processing gas 12 will be discharged through the exit zone 14. In addition, an isothermal plate 8 is arranged at the rear of the wafer holder 16 for heating the wafer 10. A (air) gap 9 may be present between the isothermal plate 8 and the back side of the wafer 10.

As shown in FIG. 1, one or more temperature-measuring elements 20 (including temperature-measuring elements 21/22/23, for example), such as infrared thermometers 20, are used to measure a rear surface temperature 301/302/303 (the top surface) of the isothermal plate 8. Notice that the rear surface of the isothermal plate 8 is the surface opposite to the wafer 10. In this preferred embodiment, three infrared thermometers 21/22/23 measure an inner zone rear surface temperature 301, a middle zone rear surface temperature 302, and an outer zone rear surface temperature 303 of the isothermal plate 8 via three viewports 201/202/203, respectively. The inner zone rear surface temperature 301 is temperature of the nearest position from the axis 15, and the outer zone rear surface temperature 303 is temperature of the farthest position from the axis 15 while the susceptor 18 rotates around the axis 15.

By the above arrangements and methods, when the susceptor 18 makes a full circle, the inner zone rear surface temperature 301, middle zone rear surface temperature 302, and outer zone rear surface temperature 303 can be obtained. By sampling, the rear surface temperature of the isothermal plate 8 of each wafer 10 can be obtained. After that, a point temperature, an average temperature, or individual rear surface temperatures of the isothermal plate 8 can be obtained by an algorithm.

As shown in FIG. 1, one or more temperature-measuring elements 30 (including temperature-measuring elements 31/32/33, for example), such as infrared thermometers 30, are used to measure a wafer-side temperature.

The wafer-side temperature, such as a surface temperature of thin-film deposited on the wafer, is a factor needed to be monitored in situ. The temperatures measured by temperature-measuring elements 30 or the infrared thermometers 30 depend on the type of the wafer 10 and the wavelength band used for measurement. If the wafer is transparent (e.g., sapphire) for infrared thermometers 30, the light will transmit through the sapphire and the temperature measured will be a front surface temperature 311/312/313, i.e., the bottom surface temperature of the isothermal plate 8. If the wafer is opaque (e.g., silica) for infrared thermometers 30, the temperature measured will be the surface temperature 321/322/323 of the wafer 10.

If the temperature-measuring elements 30 or the infrared thermometers 30 employ a specific wavelength and the deposition material for growing thin-film on the wafer can totally absorb the specific wavelength, the temperature measured will be the surface temperature of thin-film grown on the wafer 10. For example, in an embodiment the wavelength band used for measurement is between 450 nm and 400 nm, so that the temperature-measuring elements 30 or the infrared thermometers 30 can measure the surface temperature of the thin-film grown on the wafer 10.

In an embodiment of the present invention, three infrared thermometers 31/32/33 arranged under the isothermal plate 8 are used to measure an inner zone front surface temperature 311, a middle zone front surface temperature 312, and an outer zone front surface temperature 313 of the isothermal plate 8 via three viewports 211/212/213, respectively. Notice that the front surface of the isothermal plate 8 is its bottom surface facing the wafer 10. By the above arrangements, when the susceptor 18 makes a full circle, the inner zone front surface temperature 311, the middle zone front surface temperature 312, and the outer zone front surface temperature 313 of the isothermal plate 8 can be obtained. By sampling, the front surface temperature of the isothermal plate 8 of each wafer 10 can be obtained. After that, a point temperature, an average temperature, or individual front surface temperatures of the isothermal plate 8 can be obtained by an algorithm.

In an embodiment of the present invention, three infrared thermometers 31/32/33 arranged under the isothermal plate 8 are used to measure an inner zone surface temperature 321, a middle zone surface temperature 322, and an outer zone surface temperature 323 of the wafer 8 via three viewports 211/212/213, respectively. Notice that the surface temperature of the wafer is the temperature of the surface facing the processing gas 12. By the above arrangements, when the susceptor 18 makes a full circle, the inner zone surface temperature 321, the middle zone surface temperature 322, and the outer zone surface temperature 323 of the wafer 10 can be obtained. By sampling, the surface temperature of each wafer 10 can be obtained. After that, a point temperature, an average temperature, or individual surface temperatures of the wafer 10 can be obtained by an algorithm.

Figure 2:
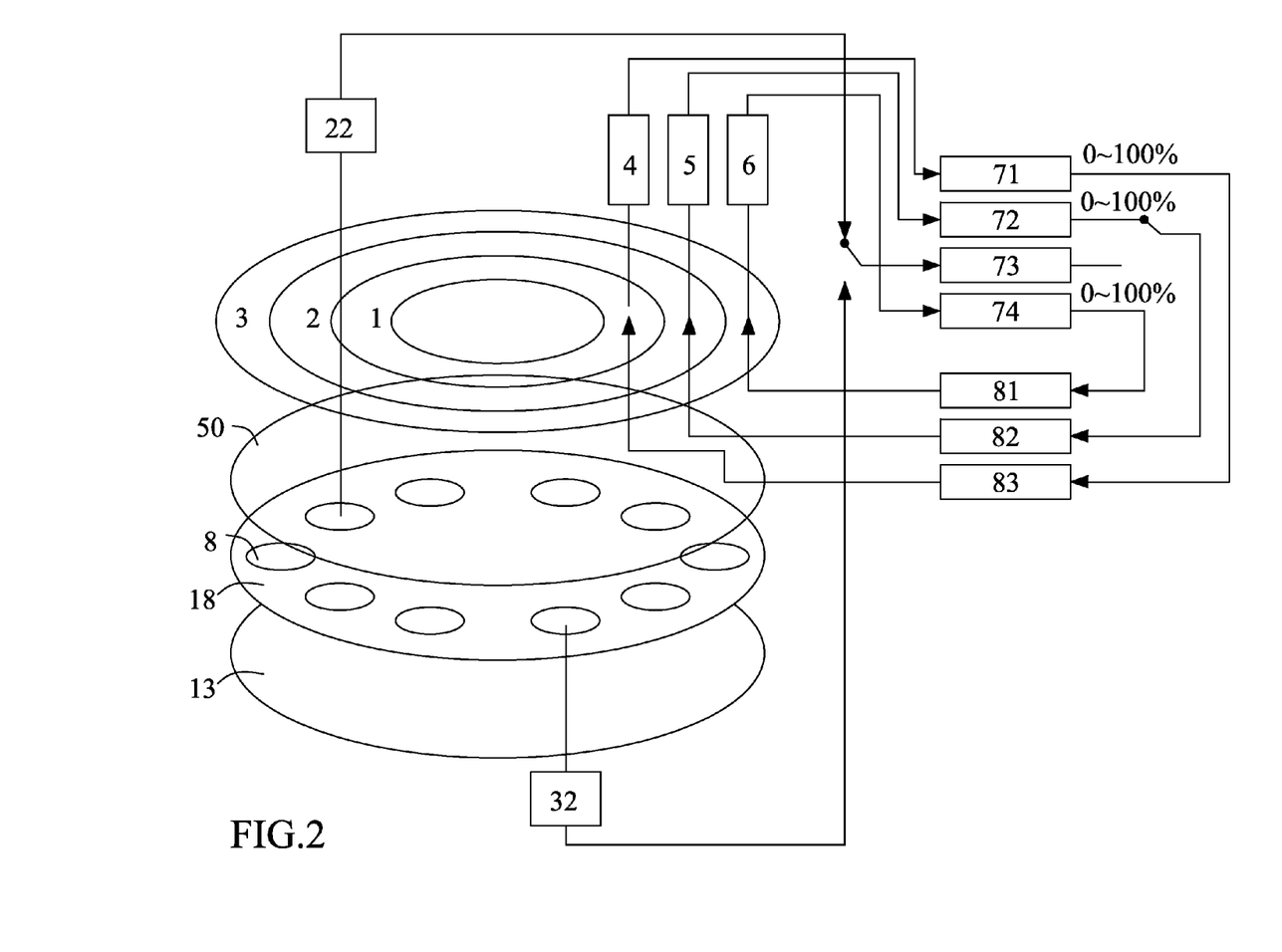
FIG. 2 is block diagram showing a temperature control configuration and method of the deposition system of FIG. 1.
Figure 3:
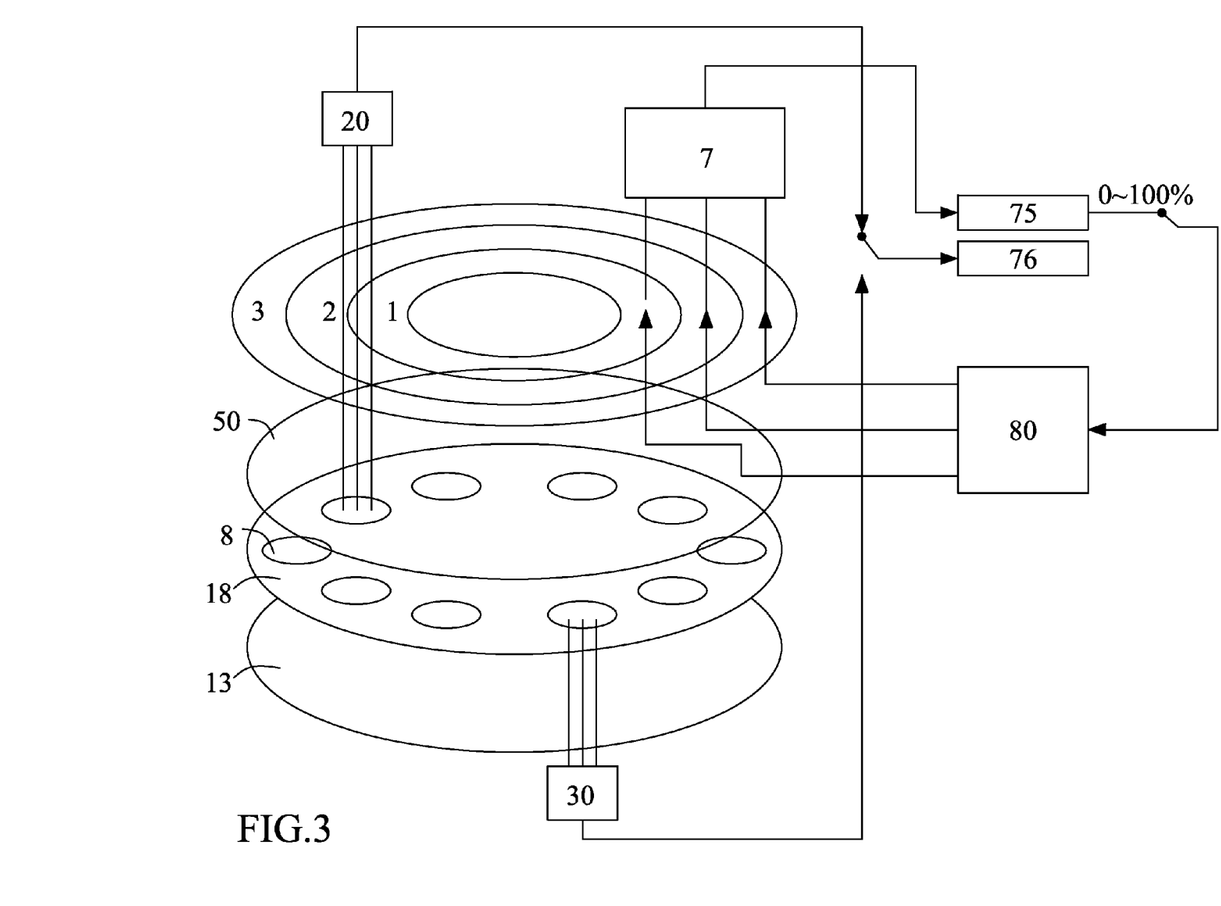
FIG. 3 is block diagram showing another temperature control configuration and method of the deposition system of FIG. 1.

In addition, a plurality of heaters, such as an inner zone heater 1, a middle zone heater 2, and an outer zone heater 3, are arranged above the isothermal plate 8 and respectively coupled to a heat source, such as thermocouples 4/5/6 or heating pipes 4/5/6, which then couple to a temperature control system 70. As shown in FIGS. 1-3, the temperature control system 70 comprises an inner zone PID (proportional-integral-derivative controller) 71, a middle zone thermocouple PID 72, a middle zone infrared thermometer PID 73, an outer zone thermocouple PID 74, a whole thermocouple PID 75, and a whole infrared thermometer PID 76. In addition, one or more power supplies, such as an inner zone power supply 81, a middle zone power supply 82, and an outer zone power supply 83, supply electricity to the inner zone heater 1, the middle zone heater 2, and the outer zone heater 3, respectively.

If the processing gas 12 contains ammonia gas and the heaters 1/2/3 have no protecting film or are not made of a non-metal material, the ammonia gas may attack the heaters 1/2/3 and reduce their life. In the preferred embodiment, a transparent shielding plate 50 is arranged between the susceptor 18 and the heaters 1/2/3, and the heat radiated from the heaters 1/2/3 will transmit through the transparent shielding plate 50 during the heating process. The transparent shielding plate 50 may be made of sapphire, and may be integrately formed or multi-layered, so as to protect the heaters 1/2/3 being attacked from the ammonia gas. In another embodiment of the present invention, the heaters 1/2/3 are made of a material that can protect the heaters 1/2/3 being attacked from the ammonia gas, and therefore the transparent shielding plate 50 is unnecessary and is omitted. In the case with transparent shielding plate, the heat radiated from the heaters 1/2/3 transmits through the transparent shielding plate 50 and reaches the rear surface (top surface) of the isothermal plate 8. The heat then is transferred to the front surface (bottom surface) of the isothermal plate 8 by heat conduction, and then heats the target. i.e., wafer 10, through the (air) gap 9.

The farther the distance between the heaters 1/2/3 and the target is, the more difficult the heaters 1/2/3 control the target. The measured temperature will be varied due to the processing conditions. For example, the thickness of the grown thin-film, e.g., GaN thin-film may be different and thus interferes with the heat radiation measurement signal, resulting in a variant of the measured temperature. This can be calibrated by the following ways: (1) calibrating the measured temperature by calibrating emissivity of the temperature-measuring elements 30 or the infrared thermometers 30; (2) employing a wavelength band between 450 nm and 400 nm to measure the surface temperature of the thin-film grown on the wafer; (3) employing a white light source to measure the absorption shift of the transmittance under different wavelengths, so as to obtain the surface temperature of the thin-film.

However, particles, the change of reactor parameters during the deposition process, and the roughness of the thin-film may affect the measured wafer-side temperature.

The present invention measures the rear surface (top surface) temperature of the isothermal plate 8 and utilizes it in a feedback control, such that the deficiencies of the prior art can be resolved.

Because a temperature difference $\Delta T$ is present between the rear surface (top surface) temperature of the isothermal plate 8 measured by the infrared thermometers 20 and the wafer-side temperature measured by the temperature-measuring elements 30, an initial rear surface (top surface) temperature of the isothermal plate 8 and an initial wafer-side temperature measured by the temperature-measuring elements 30 are obtained prior to the deposition process. After the parameters of the reactor chamber are adjusted for a period of time, a temperature calibration is performed, so that a rear surface (top surface) temperature T1 of the isothermal plate 8 measured by the temperature-measuring elements 20 and a wafer-side temperature T2 measured by the temperature-measuring elements 30 can be obtained.

The measured temperature T1 can be used for temperature control by four modes. The following takes the inner zone rear surface temperature 301 as an example to illustrate the four modes. Mode (1), when the wafer 10 is rotated to the view port 201, the infrared thermometer 21 measures the inner zone rear (top) surface temperature 301 of the isothermal plate 8 and immediately output the measured inner zone rear (top) surface temperature of the isothermal plate 8 for the temperature control. If the susceptor 18 carries eleven wafers 10, then totally 11 inner zone rear (top) surface temperatures of the isothermal plate 8 will be outputted when the susceptor 18 rotates a full circle. Mode (2), when the wafer 10 is rotated to the view port 201, the infrared thermometer 21 measures the inner zone rear (top) surface temperature 301 of the isothermal plate 8 and the measured temperature 301 is immediately outputted as an "average" inner zone rear (top) surface temperature 301 of the isothermal plate 8 for the temperature control of each wafer 10. If the susceptor 18 carries 11 wafers, then totally 11 average inner zone rear (top) surface temperatures of the isothermal plate 8 will be outputted when the susceptor 18 rotates a full circle. Mode (3), when the susceptor 18 is rotated to the view port 201, the infrared thermometer 21 measures a top surface temperature of the susceptor 18 and immediately output the measured top surface temperature of the susceptor 18 for temperature control. Mode (4), when the susceptor 18 is rotated to the view port 201, the infrared thermometer 21 measures a top surface temperature of the susceptor 18 and immediately output the measured top surface temperature of the susceptor 18 as an "average" top surface temperature of the susceptor 18 for temperature control. In this preferred, mode (1), i.e., immediately measuring the inner zone rear (top) surface temperature 301, the middle zone rear (top) surface temperature 302, and the outer zone rear (top) surface temperature 303 of the isothermal plate 8, is used.

Similarly, the measured temperature T2 can also be divided into four modes. The following takes the inner zone front surface 311 temperature as an example to illustrate the four modes, and a condition that the wafer 10 is transparent (e.g., sapphire substrate) for the temperature-measuring element 30 is assumed. Mode (1), when the wafer 10 is rotated to the view port 211, the temperature-measuring element 31 measures the inner zone front (bottom) surface temperature 311 of the isothermal plate 8 and immediately output the measured inner zone front (bottom) surface temperature 311 of the isothermal plate 8 for the temperature control. If the susceptor 18 carries eleven wafers 10, then totally 11 inner zone front (bottom) surface temperatures of the isothermal plate 8 will be outputted when the susceptor 18 rotates a full circle. Mode (2), when the wafer 10 is rotated to the view port 211, the infrared thermometer 31 measures the inner zone front (bottom) surface temperature 311 of the isothermal plate 8 and the measured temperature is immediately outputted as an "average" inner zone front (bottom) surface temperature 311 of the isothermal plate 8 for the temperature control of each wafer 10. If the susceptor 18 carries 11 wafers, then totally 11 average inner zone front (bottom) surface temperatures of the isothermal plate 8 will be outputted when the susceptor 18 rotates a full circle. Mode (3), when the susceptor 18 is rotated to the view port 211, the infrared thermometer 31 measures a bottom surface temperature of the susceptor 18 and immediately outputs the measured bottom surface temperature of the susceptor 18 for temperature control. Mode (4), when the susceptor 18 is rotated to the view port 211, the infrared thermometer 31 measures a bottom surface temperature of the susceptor 18 and immediately outputs the measured bottom surface temperature of the susceptor 18 as an "average" bottom surface temperature of the susceptor 18 for temperature control of the susceptor 18. In this preferred, mode (2) is used to obtain the average inner zone front (bottom) surface temperature of the isothermal plate 8.

In another embodiment of the present invention, the wafer 10 is opaque (e.g., silica substrate) and the temperature T2 can also be divided into four modes for temperature control. The following takes the inner zone surface temperature 321 as an example to illustrate the four modes. Mode (1), when the wafer 10 is rotated to the view port 211, the temperature-measuring element 31 measures the inner zone surface temperature 321 of the wafer 10 and immediately outputs the measured inner zone surface temperature 321 of the wafer 10 for the temperature control. If the susceptor 18 carries eleven wafers 10, then totally 11 inner zone surface temperatures 321 of the wafer 10 will be outputted when the susceptor 18 rotates a full circle. Mode (2), when the wafer 10 is rotated to the view port 211, the temperature-measuring element 31 measures the inner zone surface temperature 321 of the wafer 10 and the measured temperature is immediately outputted as an "average" inner zone surface temperature 321 of the wafer 10 for the temperature control of each wafer 10. If the susceptor 18 carries 11 wafers, then totally 11 average inner zone surface temperatures of the wafer 10 will be outputted when the susceptor 18 rotates a full circle. Mode (3), when the susceptor 18 is rotated to the view port 211, the temperature-measuring element 31 measures a bottom surface temperature of the susceptor 18 and immediately outputs the measured bottom surface temperature of the susceptor 18 for temperature control. Mode (4), when the susceptor 18 is rotated to the view port 211, the temperature-measuring element 31 measures a bottom surface temperature of the susceptor 18 and immediately outputs the measured bottom surface temperature of the susceptor 18 as an "average" bottom surface temperature of the susceptor 18 for temperature control. In this preferred embodiment, mode (2) is used to obtain the average inner zone surface temperature of the wafer 10.

At the initial of the deposition process, a temperature gap ΔT is obtained by a difference between a set temperature SET1 and temperature T2 measured by the temperature-measuring element 30. The temperature gap ΔT will be used to compensate the temperature T1 measured by the temperature-measuring element 20. That is, T1+ΔT is used as the set temperature of the temperature-measuring element 20 or the infrared thermometers 20 and is used in a feedback control. An iterative feedback control is performed to make ΔT approaches zero, such that T1+ΔT=T1, and such that the needed wafer-side temperature can be obtained. During a low temperature range, the heaters 1/2/3 are controlled by thermocouple or heat pipe 7. When the temperature is raised to a processing temperature, the temperature measured by the temperature-measuring element 20 or the infrared thermometers 20 are fed back to the whole infrared thermometer PID 76, so as to control the power outputted from the whole power supply 80 to the corresponding heaters 1/2/3.

As shown in FIG. 2, the above-mentioned temperature control method can be performed by specific zone temperature-measuring element 21/22/23. For example, the temperature measured by the middle zone infrared thermometer 22 can be used to control a set temperature of the middle zone heat source 5 (e.g., thermocouple or heating pipe), and it can also be used to control a set temperature of the inner zone heat source 4 and a set temperature of the outer zone heat source 6. In the preferred embodiment, however, as shown in FIG. 3, the inner zone, middle zone, and outer zone temperature-measuring elements or infrared thermometers 21/22/23 are independently controlled. The temperatures measured by them are used in a feedback control of the infrared thermometer 20, and it can also be used in a feedback control of the heat source 7 (e.g., thermocouple or heating pipe).

Figure 4:
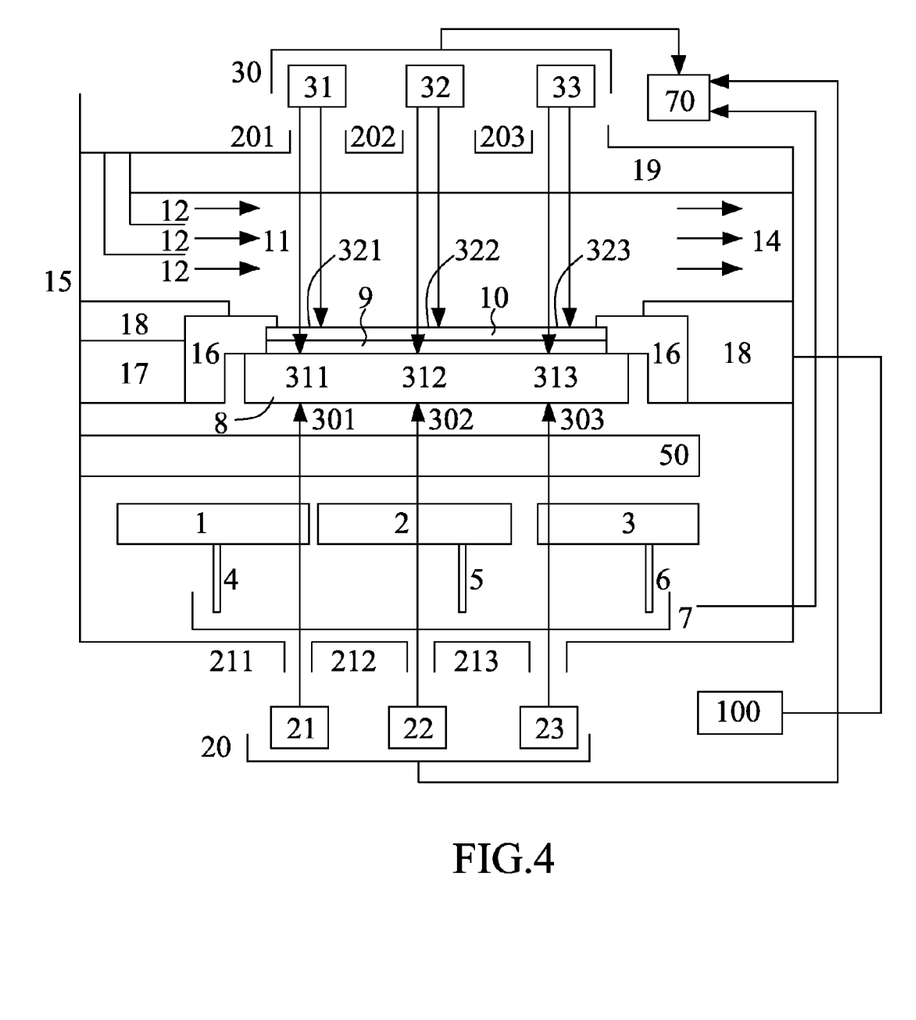
FIG. 4 is a simplified block diagram showing a (wafer Face-Up) chemical vapor deposition system and method according to another embodiment of the present invention.

FIG. 4 is a simplified diagram illustrating a deposition system and method in accordance with another embodiment of the present invention. The difference between this embodiment and the foregoing embodiment is that the deposition system of this embodiment is based on a (wafer) Facing Up configuration. In particular, the temperature-measuring elements or the infrared thermometers 21/22/23 measure the inner zone, middle zone, and outer zone rear (bottom) surface temperature 301/302/303 of the isothermal plate 8. Notice that the rear surface of the isothermal plate 8 is a surface opposite to the wafer 10. And the temperature-measuring elements or the infrared thermometers 31/32/33 measure a wafer side temperature T2.

If the wafer is transparent for the temperature-measuring elements 31/32/33 or the infrared thermometers 31/32/33, then the measured temperature T2 will be the inner zone, middle zone, and outer zone front (top) surface temperature 311/312/313 of the isothermal plate 8. If the wafer is opaque for the temperature-measuring elements 31/32/33 or the infrared thermometers 31/32/33, then the measured temperature T2 will be the inner zone, middle zone, and outer zone surface temperature 321/322/323 of the wafer. The temperature T2 also can be the surface temperature of thin-film grown on the wafer by the foregoing manners. The other detail of the deposition system and method is the same as the foregoing embodiment and thus is omitted.

Figure 5:
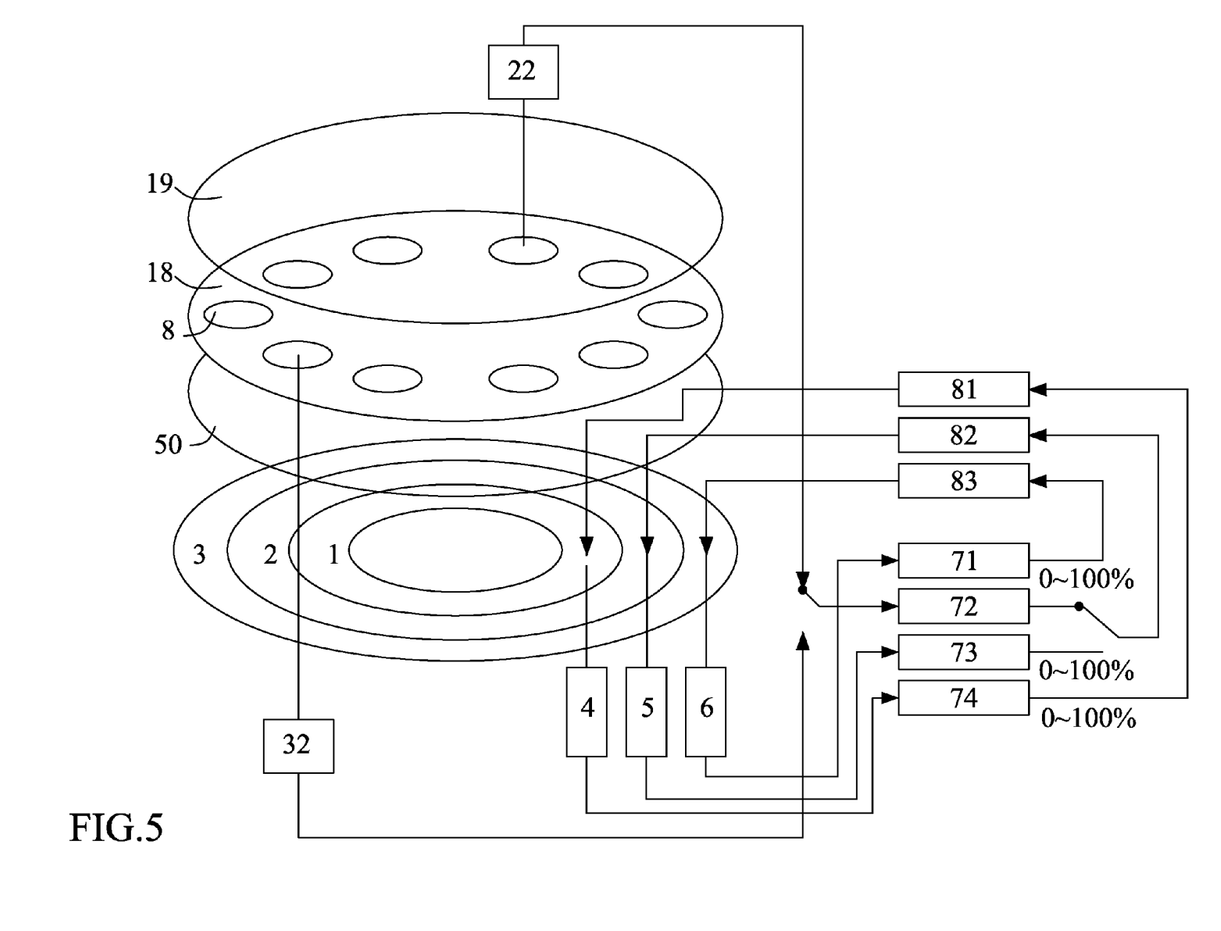
FIG. 5 is block diagram showing a temperature control configuration and method of the deposition system of FIG. 4.
Figure 6:
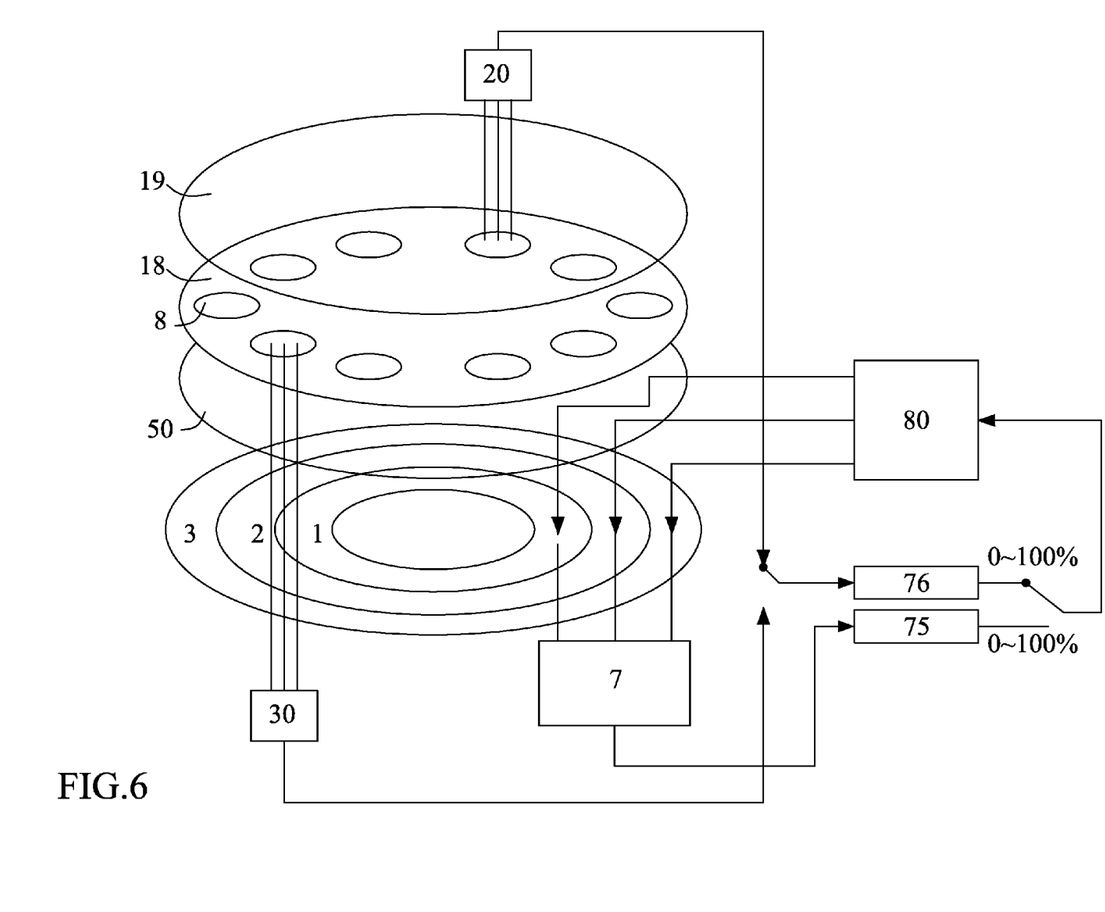
FIG. 6 is block diagram showing another temperature control configuration and method of the deposition system of FIG. 4.

As shown in FIG. 5, the temperature control of the deposition system of FIG. 4 can be performed by a specific zone temperature-measuring element 21/22/23. For example, the temperature measured by the middle zone infrared thermometer 22 can be used to control a set temperature of the middle heat source 5 (e.g., thermocouple or heating pipe), and it can also be used to control a set temperature of the inner zone heat source 4 and a set temperature of the outer zone heat source 6. In the preferred embodiment, as shown in FIG. 6, the inner zone, middle zone, and outer zone temperature-measuring elements or infrared thermometers 21/22/23 are independently controlled. The temperatures measured by them are used in a feedback control of the infrared thermometer 20, and it can also be used in a feedback control of the heat source 7 (e.g., thermocouple or heating pipe).

The present invention employs a rear surface temperature of the isothermal plate 8 in a feedback control to obtain a wafer-side temperature. Because the rear surface temperature of the isothermal plate 8 is not within the processing zone, it will not be affected by the deposition process. Therefore, the rear surface temperature of the isothermal plate 8 has a constant emissivity and the measured temperature of which will not be varied due to the deposition process.

Although specific embodiments have been illustrated and described, it will be appreciated by those skilled in the art that various modifications may be made without departing from the scope of the present invention, which is intended to be limited solely by the appended claims.

What is claimed is:

1. A chemical deposition system for controlling a surface temperature of wafer or thin-film grown on the wafer, comprising:
    a susceptor rotating about an axis;
    a plurality of wafer holders carried by the susceptor, each wafer holder carrying a wafer and rotating about its own axis, each wafer having a first surface and a second surface opposite to the first surface;
    a processing gas approaching the first surface of the wafer and being heated to form a thin-film on the first surface;
    an isothermal plate having a front surface and a rear surface opposite to the front surface and being arranged at the second surface of the wafer for heating the wafer, the front surface of the isothermal plate facing the second surface of the wafer;
    one or more temperature-measuring elements being arranged at a side of the wafer and being arranged near to the second surface of the wafer to measure a rear surface temperature of the rear surface of the isothermal plate, wherein the rear surface temperature is used to obtain a wafer-side temperature of the wafer.

2. The deposition system as set forth in claim 1, further comprising one or more wafer side temperature-measuring elements arranged at a side of the wafer and arranged near to the first surface of the wafer to measure the wafer-side temperature of the wafer.

3. The deposition system as set forth in claim 1, wherein the wafer-side temperature is the temperature of the first surface of the wafer.

4. The deposition system as set forth in claim 1, wherein the wafer-side temperature is a temperature of the front surface of the isothermal plate.

5. The deposition system as set forth in claim 1, wherein the wafer-side temperature is a surface temperature of a thin-film grown on the wafer.

6. The deposition system as set forth in claim 1, wherein the deposition system is a wafer Face Up Metal-Organic Chemical Vapor Deposition system.

7. The deposition system as set forth in claim 1, wherein the deposition system is a wafer Face Down Metal-Organic Chemical Vapor Deposition system.

8. The deposition system as set forth in claim 1, wherein the one or more temperature-measuring elements comprises three infrared thermometers for measuring an inner zone rear surface temperature, a middle zone rear surface temperature, and an outer zone rear surface temperature of the isothermal plate, and the rear surface temperature of the rear surface of the isothermal plate is obtained by a sampling treatment for the inner zone rear surface temperature, the middle zone rear surface temperature, and the outer zone rear surface temperature.

9. A method for controlling a surface temperature of wafer or thin-film grown on the wafer in a chemical deposition, comprising:
    providing a susceptor to rotate about an axis, the susceptor carrying a plurality of wafer holders with each wafer holder carrying a wafer and rotating about its own axis;
    providing a processing gas approaching a first surface of the wafer, the processing gas being heated to form a thin-film on the first surface;
    providing an isothermal plate arranged at a second surface of the wafer for heating the wafer, the second surface being opposite to the first surface, the isothermal plate having a front surface and a rear surface opposite to the front surface, the front surface of the isothermal plate facing the second surface of the wafer;
    providing one or more temperature-measuring elements arranged at a side of the wafer and arranged near to the second surface of the wafer to measure a rear surface temperature of the rear surface of the isothermal plate; and
    obtaining a wafer-side temperature of the wafer by the rear surface temperature of the isothermal plate.

10. The method as set forth in claim 9, wherein the wafer-side temperature is the temperature of the first surface of the wafer.

11. The method as set forth in claim 9, wherein the wafer-side temperature is a temperature of the front surface of the isothermal plate.

12. The method as set forth in claim 9, wherein the wafer-side temperature is a surface temperature of a thin-film grown on the wafer.

13. The method as set forth in claim 9, wherein the one or more temperature-measuring elements comprises three infrared thermometers for measuring an inner zone rear surface temperature, a middle zone rear surface temperature, and an outer zone rear surface temperature of the isothermal plate, and the rear surface temperature of the rear surface of the isothermal plate is obtained by a sampling treatment for the inner zone rear surface temperature, the middle zone rear surface temperature, and the outer zone rear surface temperature.

* * * * *